(12) United States Patent
Lu

(10) Patent No.: US 8,534,855 B2
(45) Date of Patent: Sep. 17, 2013

(54) TOUCH ELECTRIC FIREPLACE

(75) Inventor: Wei Lin Lu, Dong Guan (CN)

(73) Assignee: Dong Guan Song Wei Electric Technology Co., Ltd., Dong Guan, Guang Dong (CN)

(*) Notice: Subject to any disclaimer, the term of this patent is extended or adjusted under 35 U.S.C. 154(b) by 111 days.

(21) Appl. No.: 13/240,571

(22) Filed: Sep. 22, 2011

(65) Prior Publication Data
US 2013/0077287 A1    Mar. 28, 2013

(51) Int. Cl.
*F21V 33/00* (2006.01)
*H05B 37/02* (2006.01)

(52) U.S. Cl.
USPC ............................ 362/92; 362/282; 359/221.4

(58) Field of Classification Search
CPC .................................. F24C 3/006; G08B 3/10
USPC ............... 362/20, 364; 204/157.3; 126/500
See application file for complete search history.

(56) References Cited

U.S. PATENT DOCUMENTS

| | | | |
|---|---|---|---|
| 7,080,472 B2* | 7/2006 | Schroeter et al. | 40/428 |
| 2004/0011353 A1* | 1/2004 | Bachinski et al. | 126/512 |
| 2005/0208443 A1* | 9/2005 | Bachinski et al. | 431/8 |

FOREIGN PATENT DOCUMENTS
WO    WO-2008/062059 A2 *   5/2008

* cited by examiner

*Primary Examiner* — Tracie Y Green

(57) ABSTRACT

A touch electric fireplace comprises a housing, an imaging screen installed in the housing, a light source, a flame processing device, and a reflecting module. A window is defined on a front wall of the housing, a transparent insulator completely shields the window as well as a rim of the window, a touch area is arranged on the transparent insulator and along the rim of the window, and a touch panel is attached to a front side of the transparent insulator of the touch area; whereby, the electric fireplace is easily operated and controlled by simply touching the touch panel.

7 Claims, 4 Drawing Sheets

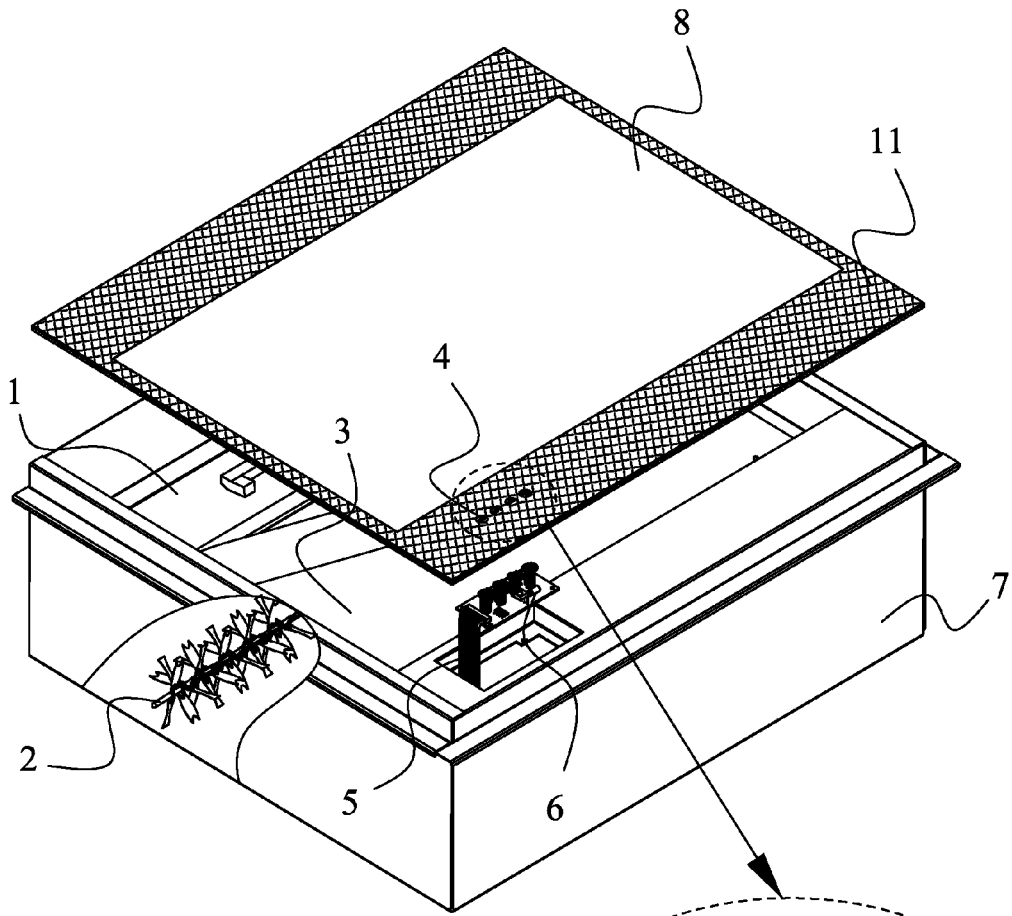
FIG. 2a
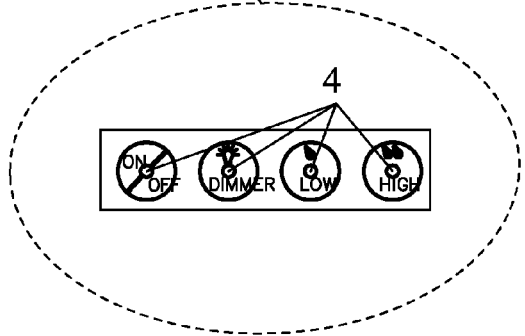
FIG. 2b
FIG. 2

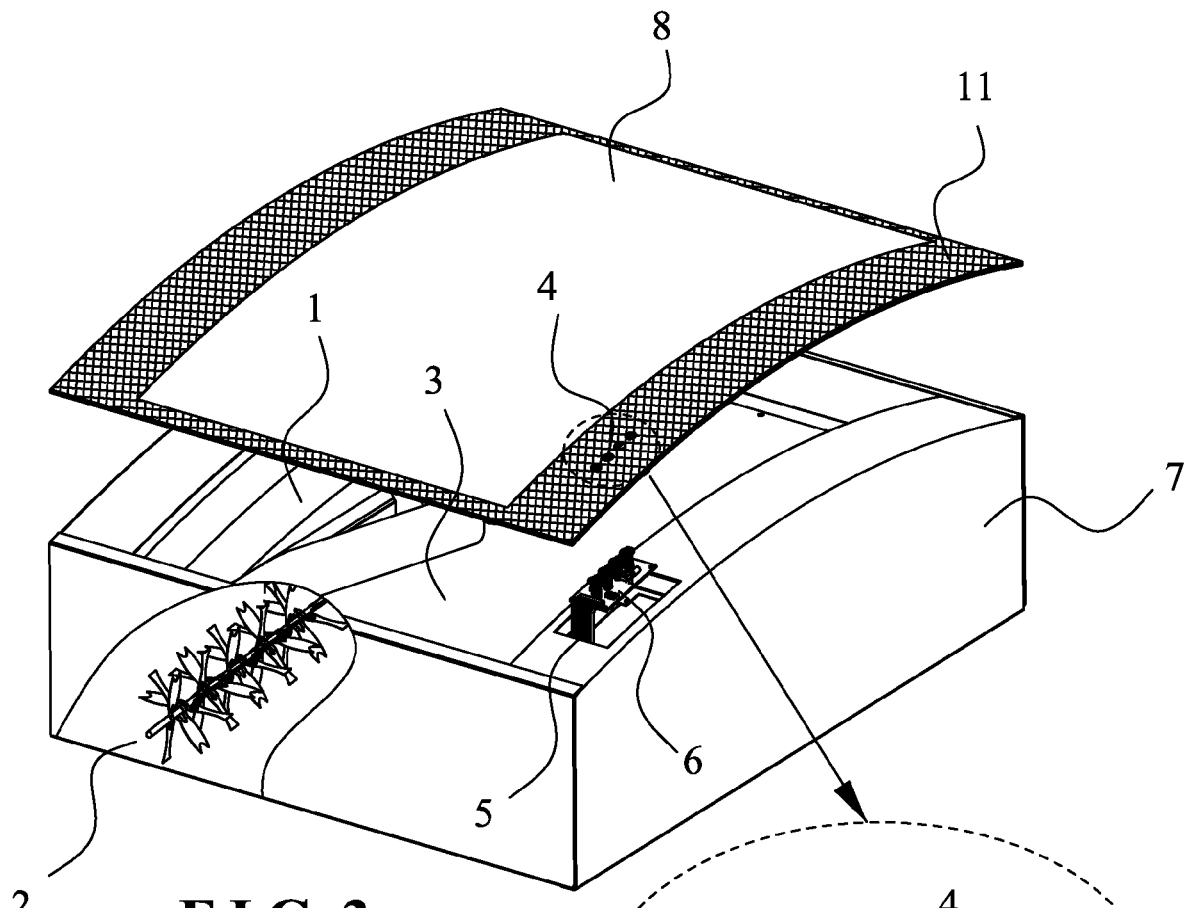
FIG. 3a
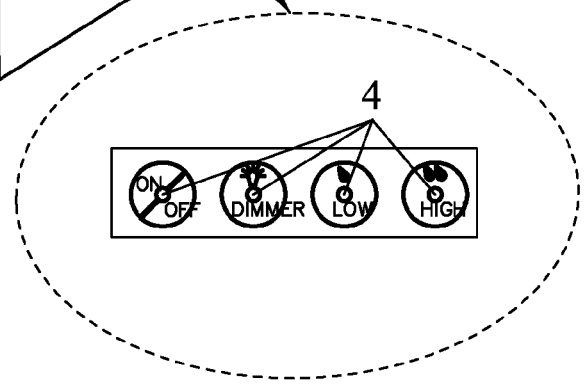
FIG. 3b
FIG. 3

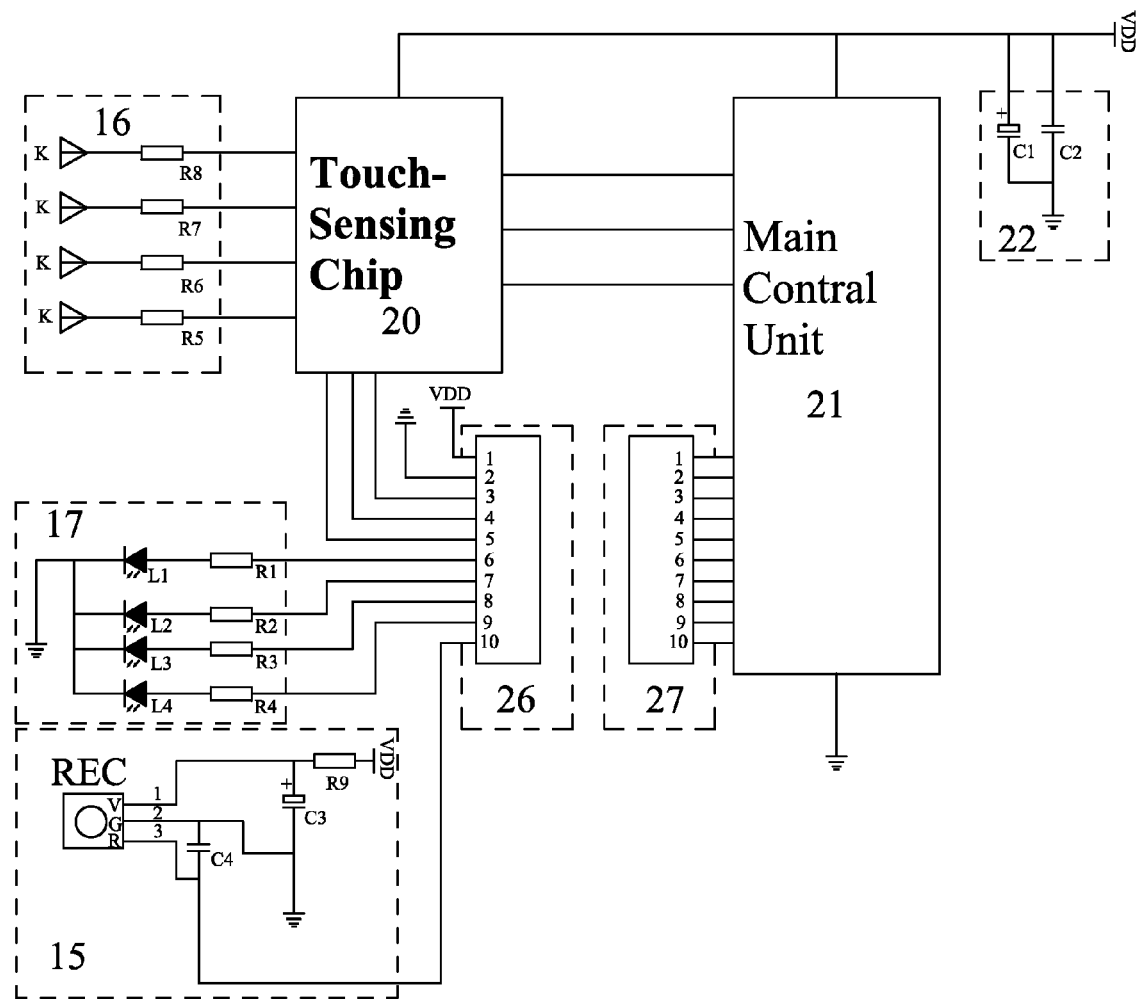
F I G. 4

TOUCH ELECTRIC FIREPLACE

BACKGROUND OF THE INVENTION

1. Field of the Invention

The present invention relates to an electric fireplace, especially to a touch electric fireplace.

2. Description of the Related Art

When the technology progresses everyday, the electric fireplaces are potentially displacing the traditional fireplaces. However, means for operating the electric fireplaces mostly adopts a mechanical switch or a flimsy button. Such mechanical switch and flimsy button provide a short using life, and they are typically built with unsatisfactory appearances. To make matters worse, the switch and the button are unable to be compactly assembled with plane glass or arc glass. Accordingly, the existing electric fireplaces basically do not cooperate with glass or isolator, so means of a touch control is also unavailable. In fact, the flimsy buttons and the mechanical switches have to be installed after an opening is defined on a front housing of the electric fireplace. Obviously, afore installation is difficult; therefore, the design of electric fireplace is limited, and the research and development are also restricted, which further affects the electric fireplace industry. Gradually, the existing electric fireplaces can not satisfy users who tend to get quality products. Further, since the existing electric fireplace defines its flimsy button or mechanical switch at the opening of the front housing, the transparent isolator can not be formed into a compact plane or a convex. Subsequently, the front cover on the transparent window of the electric fireplace will be designed monotonous, which is accordingly unattractive and unsightly.

SUMMARY OF THE INVENTION

The present invention is to provide a touch electric fireplace that allows users to directly touch a surface of the glass or the isolator at the electric fireplace for operation. Favorably, the transparent isolator could be conveniently formed into a plane or an arc-shaped surface that is convex so as to achieve a more stylish and eye-catching effect.

Afore object is achieved by following means:

A touch electric fireplace comprises a housing, an imaging screen installed in the housing, a light source, a flame processing device, and a reflecting module. A window is defined on a front wall of the housing, a transparent insulator completely shields the window as well as a rim of the window, a touch area is arranged on the transparent insulator and along the rim of the window, a touch panel is attached to a front side of the transparent insulator of the touch area, a touch unit is disposed at a back side of the transparent insulator, confronting the touch panel, a main control board is connected to the other end of the touch unit, and the main control board is fixed in the housing.

Accordingly, the present invention has following advantages:

1. By means of the touch panel, the touch unit, and the main control board on the electric fireplace, users are able to directly touch the touch panel for operating the electric fireplace. This present invention is especially stylish, durable, and convenient.

2. When the transparent isolator at the front housing is formed into a plane or a convex, the transparent isolator completely shields the window and the rim thereof. The touch function adopted further allows the transparent isolator and the housing to be neatly assembled. Thus, such product is not only novel but also acceptable for users.

3. When the touch area on the transparent isolator cooperates with the touch panel, the touch unit, and the main control board, no opening has to be defined at the rims of the housing and the transparent isolator for installing the mechanical switch or the flimsy button. Evidently, the traditional button is simplified. The trouble that an opening has to be defined for further installation is removed. Thus, the transparent isolator of the present invention could be more conveniently installed.

4. By means of the touch panel and the touch unit are respectively designed at two opposite sides of the transparent isolator, the touch area that would be touched by users' fingers and the circuits area are completely separated. Thus, the product is waterproof. Namely, even users' fingers are wet, neither an electric shock nor a short circuit would be resulted. As a result, the present invention further provides a using safety and concurrently prolongs the using life.

BRIEF DESCRIPTION OF THE DRAWINGS

FIG. 2 is an exploded view showing a transparent housing and a housing of the present invention;

FIG. 2a is a schematic view showing the transparent isolator in FIG. 2 being designed plane;

FIG. 2b is an enlarged view showing a touch panel of the present invention;

FIG. 3 is an exploded view showing another transparent isolator and the housing of the present invention;

FIG. 3a is a schematic view showing the transparent isolator in FIG. 3 being designed convex;

FIG. 3b is an enlarged view showing the touch panel in FIG. 3; and

FIG. 4 is a circuit diagram of the present invention.

DETAILED DESCRIPTION OF THE PREFERRED EMBODIMENTS

Figure 1:
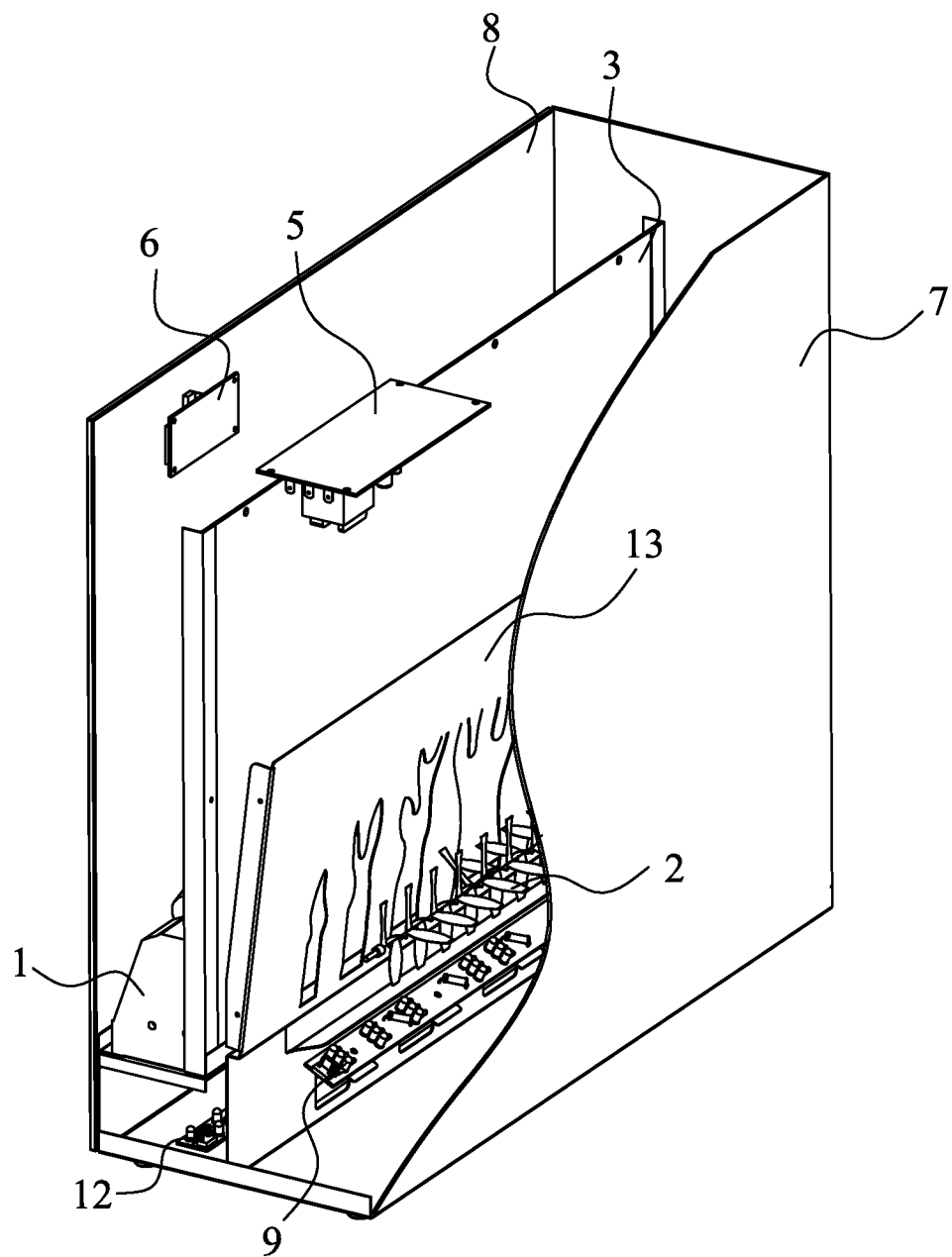
FIG. 1 is a schematic view showing inner structures of the present invention.

FIGS. 1 to 4 show a preferred embodiment of the present invention. The touch electric fire place comprises a housing 7, an imaging screen 3, a coal light source 12, an imaging light source, a flame processing device 13, a reflection processing device 2, a transparent isolator 8, a touch unit 6, and a main control board 5.

Referring to FIG. 1, the housing 7 could be freely built into a classic formation or a stylish formation in accordance with the practical demands. In this embodiment, the housing is generally formed into a rectangular solid, and various components are installed in the housing 7. Especially, a window is defined on a front wall of the housing. Wherein, the transparent isolator 8 could be designed by a plane or a convex that is able to compactly shield a rim of the housing 7. In order to enhance the electric fireplace, a periphery of the transparent isolator 8 is printed by a pattern layer with divergent colors and decorative designs. The transparent isolator 8 is installed on the window at a front wall of the housing 7, along the rim of the housing 7. A supporting frame is disposed on a bottom of the housing 7, at a back side of the transparent isolator 8. Emulating coal 1 is placed on the supporting frame, so that the electric fireplace is able to offer a vivid flame image. The imaging screen 3 is set straight on the supporting frame, behind the emulating coal 1. The flame processing device 13 is installed in back of the imaging screen 3. A bottom of the flame processing device 13 is compactly close to a bottom of the imaging screen 3. A certain distance is reserved between a top of the flame processing unit 13 and the imaging screen 3. Driven by a motor, the reflection processing device 2 is able to rotate. Wherein, the reflection processing device 2 is installed at a bottom of a backside of the flame processing unit 13. The coal light source 12 is placed on the bottom of the housing 7 that is under the supporting frame. Light of the coal light source 12 gets into the emulating coal 1, so that the emulating coal 1 looks burning. The imaging light source 9 is disposed under the reflection processing device 2, light of the imaging light source 9 is projected on the imaging screen 3. The main control board 5 is embedded in the housing 7 and fixed above the imaging screen 3.

Referring to FIGS. 2 and 3, a surface of the transparent isolator 8 is assembled with a touch panel 4. The touch panel 4 and the main control board 5 are electrically connected. A print layer 11 is placed between the touch panel 4 and the transparent isolator. The touch panel 4 allows the print layer 11 to be freely printed around the periphery of the transparent isolator 8. Besides, the touch panel 4 includes a mark layer 10 and an LED lamp window. The LED lamp window is a transparent window that provides no opening and no print layer. The mark layer 10 is printed on a rim of the LED lamp window. The mark layer 10 could be ON/OFF, DIMMER, LOW, HIGH, or the like instruction letters.

The touch unit 6 is disposed at a backside of the touch panel 4. The touch unit 6 further includes a touch-conductive pole, a touch-sensing chip, an LED pilot lamp, and an infrared receiver that are all connected to the main control board 5, respectively. The touch-conductive pole is installed at a backside of the LED lamp window. The LED pilot lamp is installed at a center of the touch-conductive pole. In this embodiment, there are four LED pilot lamps, and there are four touch-conductive poles.

In operation, users touch the touch panel 4 for controlling, and the touch unit 6 outputs signals to the main control board 5. Accordingly, the imaging light source 9 is controlled to emit warm white light. Wherein, the light is reflected to the flame processing device 13 via the reflection processing device 2 for processing into a simulate flame. Whereby, the processed simulate flame is projected to the imaging screen 3 and a flame image is resulted. Thus, users would see the lifelike flame in front of the transparent isolator 8.

Referring to FIG. 4, a circuit board module of the touch unit 6 includes a touch-sensing chip 20, a touch-sensing input circuit 16, an LED pilot lamp circuit 17, a power filter circuit 22, a first connector 26, a second connector 27, a main control unit MCU 21, and a signal receiving circuit 15. The touch-sensing chip 20 and a power terminal of the main control unit MCU 21 are respectively connected to the power filter circuit 22. The first connector 26 and the second connector 27 are respectively connected to the touch-sensing chip 20 as well as a signal transmission port of the main control unit MCU 21. An output signal terminal of the touch-sensing chip 20 is connected to the main control unit MCU 21, and an input control terminal thereof is connected to the touch-sensing input circuit 16. The signal receiving circuit 15 and the LED pilot lamp circuit 17 are respectively connected to the first connector 26.

Components of the circuit module and its correlation relationships are depicted as follows:

The touch-sensing input circuit 16 includes four touch-conductive poles K and four input resistances R5, R6, R7, R8. Each end of the touch-conductive poles K is respectively connected to each one end of the input resistances R5, R6, R7, R8. Each the other end of the input resistances R5, R6, R7, R8 is respectively connected to an input terminal of the touch-sensing chip 20. The touch-sensing chip 20 samples and processes the input signal and then transmits the output signal to the main control unit MCU 21 via the first connector 26 and the second connector 27. In this embodiment, the touch-conductive pole K adopts a conductive spring.

The LED pilot lamp circuit 7 includes LED lamps L1, L2, L3, L4 and current limiting resistances R1, R2, R3, R4. Each one end of the LED lamps L1, L2, L3, L4 is respectively connected to each one end of the current limiting resistances R1, R2, R3, R4. Each the other end of the current limiting resistances R1, R2, R3, R4 is connected to an output signal terminal corresponding to the first connector 26. The main control unit MCU 21 outputs driving signals to the second connector 27. Accordingly, the second connector 27 is correspondingly connected to the first connector 26. Each the other end of the LED lamps L1, L2, L3, L4 is connected to a ground terminal, thereby contributing to a ground loop. The light color of the LED lamps L1, L2, L3, L4 could be red, yellow, green, or blue. In this embodiment, the light color of the LED pilot lamp is red. Moreover, the LED lamps L1, L2, L3, L4 could be packed by plugin or patch. These LED lamps should be correspondingly placed at centers of sensing buttons of the touch panel 4.

The power filter circuit 22 includes an electrolytic capacitor C1 and a ceramic capacitor C2. One ends of the electrolytic capacitor C1 and the ceramic capacitor C2 are connected to a positive pole VDD of a power supply. The other ends of the electrolytic capacitor C1 and the ceramic capacitor C2 are connected to the ground terminal. The power filter circuit 22 helps the touch-sensing chip 20 and the main control unit MCU 21 enhance their anti-interference ability from ripples. The touch-sensing chip 20 and the main control unit MCU 21 share the same power and the same ground terminal.

The signal receiving circuit 15 includes an infrared receiver REC, a current limiting resistance R9, an electrolytic capacitor C3, and a ceramic capacitor C4. One ends of the electrolytic capacitor C3 and the current limiting resistance R9 are connected to a power terminal of the infrared receiver REC. The other end of the current limiting resistance R9 is connected to the positive pole VDD. The other ends of the ceramic capacitor C4 and the electrolytic capacitor C3 are connected to each other and then further attached to a ground terminal of the infrared receiver REC for forming a community ground. A signal terminal of the infrared receiver REC is connected to one end of the ceramic capacitor C4. When a signal is received and transmitted to a correspondent port of the first connector 26, the second connector 27 are provided for transmitting the signal to a signal input port of the main control unit MCU 21. Thereby, the signal is decoded for conducting instructions. The infrared receiver REC could be freely installed on the touch panel 4 or wiredly connected to a center of the housing 7 or to a backside of the imaging screen 3. In this embodiment, the infrared receiver REC is wiredly connected for achieving a convenient installation.

Principles adopted in the circuits of the touch electric fireplace are as follows: When users' fingers touch the touch-conductive pole K of the touch-sensing input circuit 16, a capacitor pulse signal is brought about between the touch-conductive pole K and the fingers. Whereby, the capacitor pulse signal is sent into the touch-sensing chip 20. After the touch-sensing chip 20 processes the signal, correspondent voltage would be output to the main control unit MCU 21 for executing correlative instructions. At the same time, the signal is output for controlling the LED pilot lamp circuit 17, so that the signals corresponding to users' touching would be identified as button information. Accordingly, the electric fireplace could be operated. Powers of the touch-sensing chip 20 and the main control unit MCU 21 are firstly processed by the power filter circuit 22 for further provision. The first connector 26 and the second connector 27 are adopted to connect transmission of the touch-sensing chip 20 and the main control unit MCU 21. The touch-sensing chip 20 allows multiple signals to be switched to the main control unit 21 for processing. Wherein, the touch-sensing chip 20 further controls the switch of the touch-sensing signal; the main control unit 21 further executes instructions from the relative signals.

I claim:

1. A touch electric fireplace comprising a housing, an imaging screen installed in said housing, a light source, a flame processing device, and a reflecting module; characterized in that, a window is defined on a front wall of said housing, a transparent insulator completely shields said window as well as a rim of said window, a touch area is arranged on said transparent insulator and along said rim of said window, a touch panel is attached to a front side of said transparent insulator of said touch area, a touch unit is disposed at a back side of said transparent insulator, confronting said touch panel, a main control board is connected to the other end of said touch unit, and said main control board is fixed in said housing, wherein, said touch panel includes a mark layer, a print layer, and an LED lamp window; said LED lamp window is transparent and defined without openings or prints; said mark layer is printed at a rim of said LED lamp window; said print layer is placed between said touch panel and said transparent insulator.

2. The fireplace as claimed in claim 1, wherein, a circuit board module of said touch unit includes a touch-sensing chip, a touch-sensing input circuit, an LED pilot lamp circuit, a power filter circuit, a first connector, a second connector, a main control unit MCU, and a signal receiving circuit; said touch-sensing chip and a power terminal of said main control unit MCU are respectively connected to said power filter circuit; said first connector and said second connector are respectively connected to said touch-sensing chip as well as a signal transmission port of said main control unit MCU; an output signal terminal of said touch-sensing chip is connected to said main control unit MCU, and an input control terminal thereof is connected to said touch-sensing input circuit; said signal receiving circuit and said LED pilot lamp circuit are respectively connected to said first connector.

3. The fireplace as claimed in claim 2, wherein, said fireplace further includes a touch-conductive pole, an LED pilot lamp, and an infrared receiver; said touch-conductive pole is connected to said touch-sensing input circuit; said LED pilot lamp is connected to said LED pilot lamp circuit; said infrared receiver is connected to said signal receiving circuit; said touch-conductive pole is arranged to face said transparent window; said LED pilot lamp is set at a center of said touch-conductive pole; said infrared receiver is placed between a touch control chip and said touch-conductive pole; said touch control chip is connected to said main control board.

4. The fireplace as claimed in claim 2, wherein, said touch-sensing input circuit includes plural touch-conductive poles K and plural input resistances R5, R6, R7, R8; each end of said touch-conductive poles K is respectively connected to each one end of said input resistances R5, R6, R7, R8; each the other end of said input resistances R5, R6, R7, R8 is respectively connected to an input terminal of said touch-sensing chip.

5. The fireplace as claimed in claim 2, wherein, said LED pilot lamp circuit includes LED lamps L1, L2, L3, L4 and current limiting resistances R1, R2, R3, R4; each one end of said LED lamps L1, L2, L3, L4 is respectively connected to each one end of said current limiting resistances R1, R2, R3, R4; each the other end of said current limiting resistances R1, R2, R3, R4 is connected to said output signal terminal corresponding to said first connector; each the other end of said LED lamps L1, L2, L3, L4 is connected to a ground terminal, thereby contributing to a ground loop.

6. The fireplace as claimed in claim 2, wherein, said power filter circuit includes an electrolytic capacitor C1 and a ceramic capacitor C2; one ends of said electrolytic capacitor C1 and said ceramic capacitor C2 are connected to a positive pole VDD of a power supply; the other ends of said electrolytic capacitor C1 and said ceramic capacitor C2 are connected to a ground terminal.

7. The fireplace as claimed in claim 2, wherein, said signal receiving circuit includes an infrared receiver REC, a current limiting resistance R9, an electrolytic capacitor C3, and a ceramic capacitor C4; one ends of said electrolytic capacitor C3 and said current limiting resistance R9 are connected to a power terminal of said infrared receiver; the other end of said current limiting resistance R9 is connected to a positive pole VDD of a power supply; the other ends of said ceramic capacitor C4 and said electrolytic capacitor C3 are connected with each other and then further attached to a ground terminal of said infrared receiver for forming a community ground; a signal terminal of said infrared receiver REC is connected to one end of said ceramic capacitor C4; when a signal is received and transmitted to a correspondent port of said first connector, said second connector 27 are provided for transmitting said signal to a signal input port of said main control unit MCU.

* * * * *